United States Patent
Ker et al.

(10) Patent No.: US 7,710,696 B2
(45) Date of Patent: May 4, 2010

(54) TRANSIENT DETECTION CIRCUIT FOR ESD PROTECTION

(75) Inventors: Ming-Dou Ker, Hsinchu (TW);
Cheng-Cheng Yen, Hsinchu (TW);
Chi-Sheng Liao, Hsinchu (TW);
Tung-Yang Chen, Tainan County (TW)

(73) Assignees: Himax Technologies Limited, Tainan County (TW); National Chiao-Tung University, Hsinchu (TW)

( * ) Notice: Subject to any disclaimer, the term of this patent is extended or adjusted under 35 U.S.C. 154(b) by 162 days.

(21) Appl. No.: 12/018,229

(22) Filed: Jan. 23, 2008

(65) Prior Publication Data

US 2009/0187361 A1 Jul. 23, 2009

(51) Int. Cl.
*H02H 3/22* (2006.01)
(52) U.S. Cl. ........................................ 361/56; 361/111
(58) Field of Classification Search ............... 361/56, 361/111
See application file for complete search history.

(56) References Cited

U.S. PATENT DOCUMENTS

| 6,233,130 | B1 * | 5/2001 | Lin ............................ 361/118 |
| 6,385,021 | B1 * | 5/2002 | Takeda et al. ................ 361/56 |
| 7,280,328 | B2 * | 10/2007 | Arai et al. .................... 361/56 |
| 7,477,498 | B2 * | 1/2009 | Huebl ......................... 361/56 |
| 2007/0097568 | A1 * | 5/2007 | Miske ......................... 361/56 |

* cited by examiner

*Primary Examiner*—Danny Nguyen
(74) *Attorney, Agent, or Firm*—Thomas, Kayden, Horstemeyer & Risley

(57) ABSTRACT

A transient detection circuit including a detecting unit, a setting unit, and a memory unit. The transient detection circuit provides an information signal to an external instrument when an electrostatic discharge (ESD) event occurs. The detecting unit is coupled between a first power line and a second power line for detecting the ESD event. The setting unit sets a level of a first node according to the detection result. The memory unit controls the information signal according to the level of the first node. The information signal is at a first level when the ESD event occurs in the first power line.

18 Claims, 5 Drawing Sheets

US 7,710,696 B2

TRANSIENT DETECTION CIRCUIT FOR ESD PROTECTION

BACKGROUND OF THE INVENTION

1. Field of the Invention

The invention relates to a transient detection circuit for electrostatic discharge (ESD) protection, and more particularly to a transient detection circuit providing an information signal to an external instrument when an ESD event occurs.

2. Description of the Related Art

Electrostatic discharge (ESD) event has become an important reliability issue for integrated circuits (ICs). To meet component-level ESD reliability, on-chip ESD protection circuits have been added to the I/O cells and power (VDD and VSS) cells of CMOS ICs. Besides component-level ESD stress, a system-level ESD issue is an increasingly significant reliability issue for CMOS IC products. The issues result from strict requirements of reliability test standards, such as system-level ESD test for electromagnetic compatibility (EMC) regulation.

BRIEF SUMMARY OF THE INVENTION

Transient detection circuits are provided. An exemplary embodiment of a transient detection circuit comprises a detecting unit, a setting unit, and a memory unit. The transient detection circuit provides an information signal to an external instrument when an electrostatic discharge (ESD) event occurs. The detecting unit is coupled between a first power line and a second power line for detecting the ESD event. The setting unit sets a level of a first node according to the detection result. The memory unit controls the information signal according to the level of the first node. The information signal is at a first level when the ESD event occurs in the first power line.

Integrated circuits are also provided. An exemplary embodiment of an integrated circuit comprises a core unit and a transient detection circuit. The integrated circuit provides an information signal to an external instrument when an electrostatic discharge (ESD) event occurs. The core unit is coupled between a first power line and a second power line for executing related functions. The transient detection circuit comprises a detecting unit, a setting unit, and a memory unit. The transient detection circuit provides an information signal to an external instrument when an electrostatic discharge (ESD) event occurs. The detecting unit is coupled between a first power line and a second power line for detecting the ESD event. The setting unit sets a level of a first node according to the detection result. The memory unit controls the information signal according to the level of the first node. The information signal is at a first level when the ESD event occurs in the first power line.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
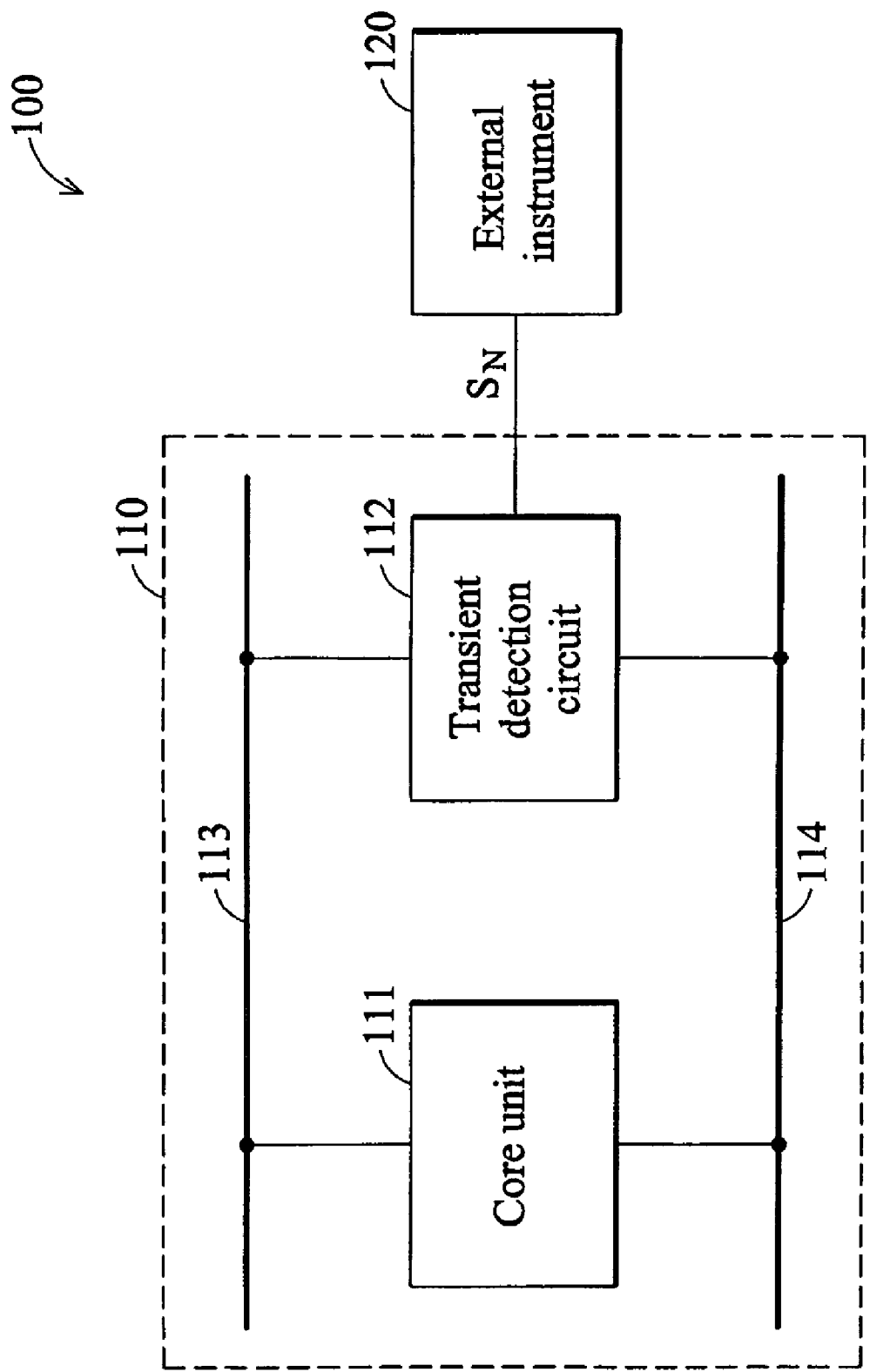
FIG. 1 is a schematic diagram of an exemplary embodiment of a measurement system.

FIG. 1 is a schematic diagram of an exemplary embodiment of a measurement system. The measurement system 100 comprises an integrated circuit 110 and an external instrument 120. When an ESD event occurs in the integrated circuit 110, the integrated circuit 110 immediately notices the external instrument 120. The integrated circuit 110 comprises a core unit 111 and a transient detection circuit 112. In this embodiment, the integrated circuit 110 is capable of accepting a system-level ESD test.

The core unit 111 is coupled between power lines 113 and 114 and executes related functions according to integrated circuit 110 type. For example, if the integrated circuit 110 is an analog-to-digital converter (ADC), the core unit 111 executes the related transforming functions. The transient detection circuit 112 is also coupled between power lines 113 and 114. In a system-level ESD test, if an ESD event occurs in the power line 113 and the power line 114 is grounded, the transient detection circuit 112 immediately provides an information signal $S_N$ to the external instrument 120.

Figure 2:
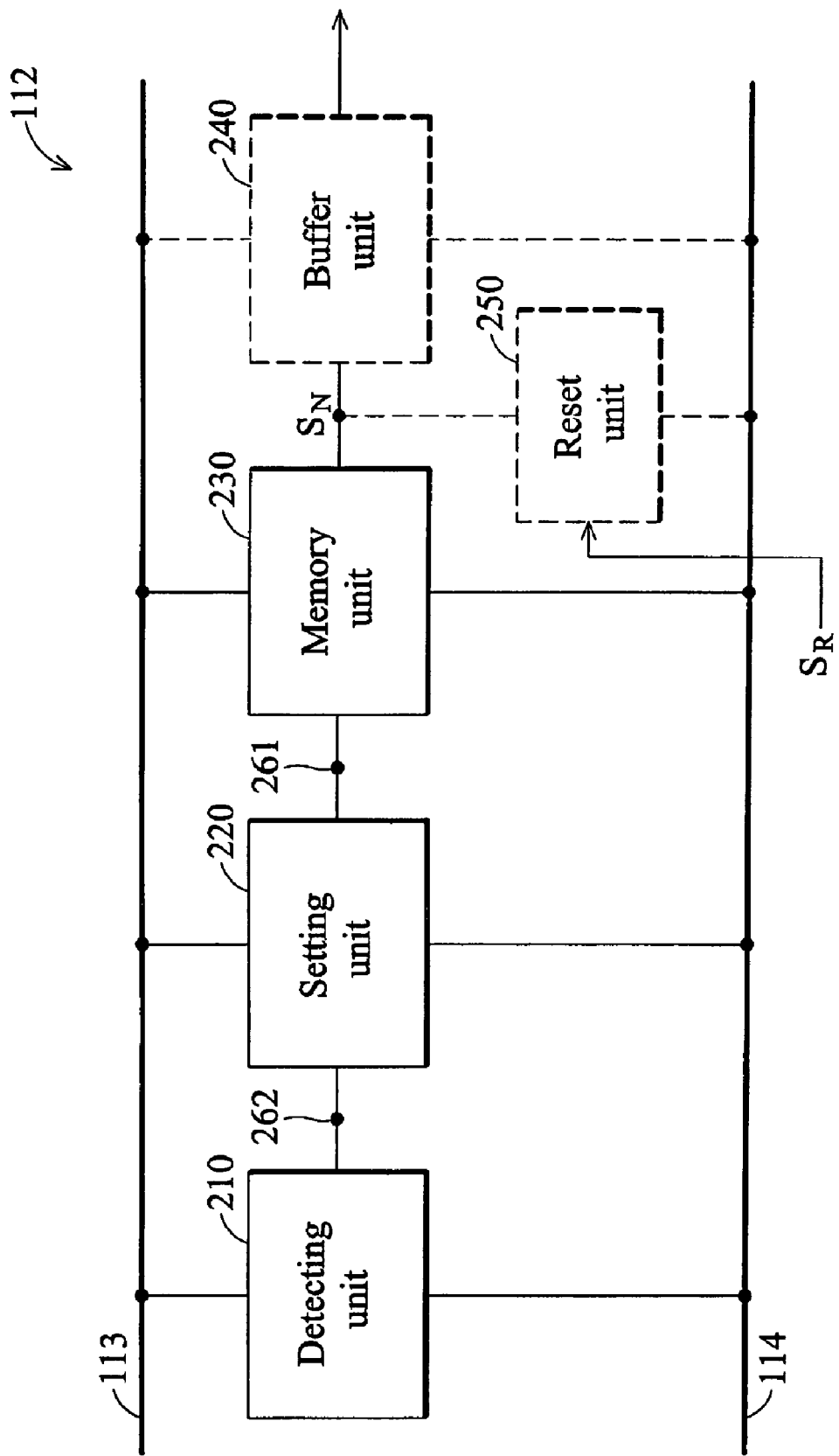
FIG. 2 is a schematic diagram of an exemplary embodiment of a transient detection circuit.

FIG. 2 is a schematic diagram of an exemplary embodiment of a transient detection circuit. The transient detection circuit 112 comprises a detecting unit 210, a setting unit 220, a memory unit 230, a buffer unit 240, and a reset unit 250. The detecting unit 210 is coupled between the power lines 113 and 114 for detecting the ESD event. The setting unit 220 sets a level of a node 261 according to the detection result. The setting unit 220 can be coupled between the detecting unit 210 and the power line 113 or between the detecting unit 210 and the power line 114. The memory unit 230 controls the information signal $S_N$ according to the level of the node 261. The information signal $S_N$ is at a first level when the ESD event occurs in the power line 113. The first level is a high level or a low level.

The buffer unit 240 is coupled between the memory unit 230 and the external instrument 120 for increasing a driving capability of the information signal $S_N$. In this embodiment, the reset unit 250 is coupled between the buffer unit 240 and the power line 114 for resetting the information signal $S_N$. In another embodiment, the reset unit 250 is coupled between the buffer unit 240 and the power line 113. When the reset unit 250 receives a reset signal $S_R$, the reset unit 250 controls the information signal $S_N$ at a second level. In some embodiments, the buffer unit 240 or the reset unit 250 is selectively omitted or the buffer unit 240 and the reset unit 250 are omitted for reducing cost. When the buffer unit 240 is omitted, the memory unit 230 directly provides the information signal $S_N$ to the external instrument 120.

Additionally, the first level is opposite to the second level. When the first level is a high level, the second level is a low level. Similarly, when the first level is a low level, the second level is a high level.

Figure 3A:
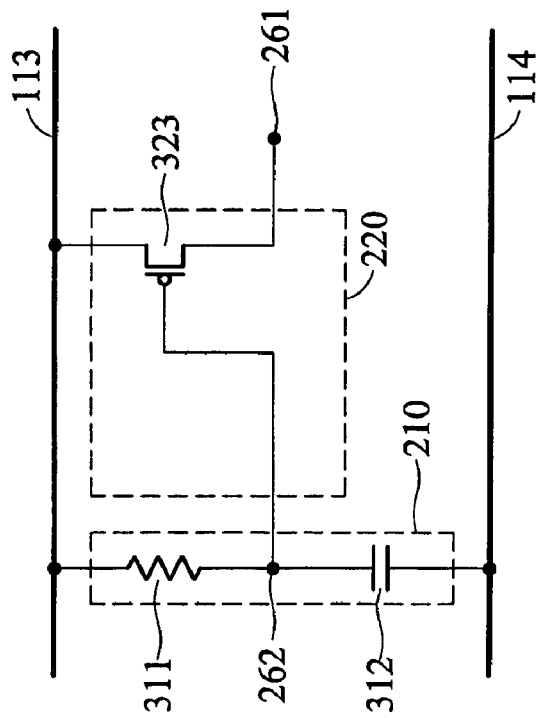
FIG. 3A is a schematic diagram of an exemplary embodiment of a detecting unit and a setting unit.

FIG. 3A is a schematic diagram of an exemplary embodiment of a detecting unit and a setting unit. The detecting unit 210 comprises a resistor 311 and a capacitor 312. The resistor 311 is coupled between the power line 113 and a node 262. The capacitor 312 is coupled between the node 262 and the power line 114. The resistor 311 and the capacitor 312 define a delay constant. The delay constant exceeds the duration of an ESD pulse and is less than the initial rising time of a signal, wherein the signal is received by power line 113.

When an ESD event occurs in the power line 113 and the power line 114 is grounded, the node 262 is at a low level because the delay constant exceeds the duration of an ESD pulse. When the ESD event does not occur, if the level of the power line 113 is at a high level and the level of the power line 114 is at a low level, the node 262 is at the high level.

In this embodiment, the setting unit 220 comprises an inverter 321 and an N type transistor 322. The inverter 321 comprises an input terminal coupled to the node 262. The N type transistor 322 comprises a gate coupled to an output terminal of the inverter 321, a source coupled to the power line 114, and a drain coupled to the node 261. When an ESD event occurs in the power line 113 and the power line 114 is grounded, the N type transistor 322 is turned on because the node 262 is at the low level. Thus, the node 261 is at the low level.

Figure 3B:
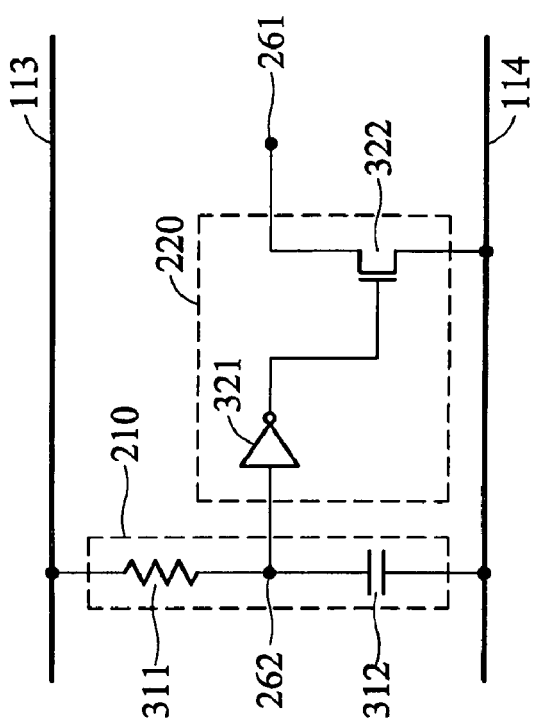
FIG. 3B is a schematic diagram of another exemplary embodiment of a detecting unit and a setting unit.

FIG. 3B is a schematic diagram of another exemplary embodiment of a detecting unit and a setting unit. FIG. 3B is similar to FIG. 3A with the exception that the setting unit 220 is a P type transistor 323. The P type transistor 323 comprises a gate coupled to the node 262, a source coupled to the power line 113, and a drain coupled to the node 261. When an ESD event occurs in the power line 113 and the power line 114 is grounded, the P type transistor 323 is turned on because the node 262 is at the low level. Thus, the node 261 is at the high level.

Figure 4A:
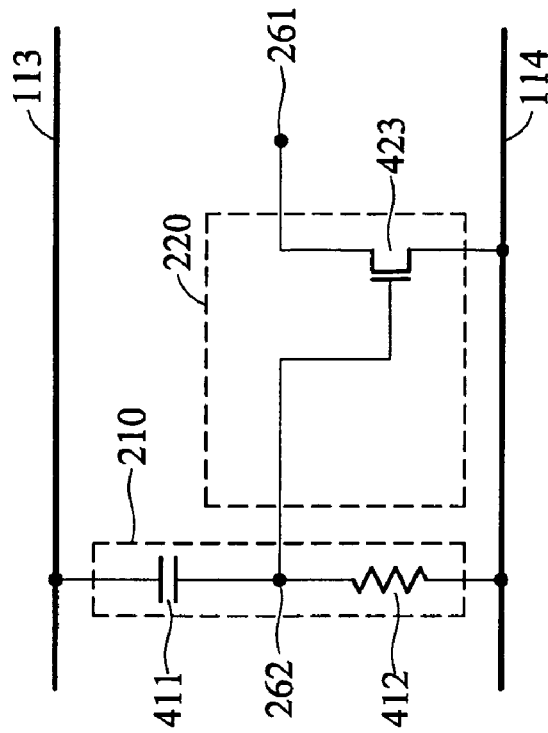
FIG. 4A is a schematic diagram of another exemplary embodiment of a detecting unit and a setting unit.

FIG. 4A is a schematic diagram of another exemplary embodiment of a detecting unit and a setting unit. The detecting unit 210 comprises a capacitor 411 and a resistor 412. The capacitor 411 is coupled between the power line 113 and the node 262. The resistor 412 is coupled between the node 262 and the power line 114. When an ESD event occurs in the power line 113, the node 262 is at a high level due to the characteristic of the capacitor 411.

In this embodiment, the setting unit 220 comprises an inverter 421 and a P type transistor 422. The inverter 421 comprises an input terminal coupled to the node 262. The P type transistor 422 comprises a gate coupled to an output terminal of the inverter 421, a source coupled to the power line 113, and a drain coupled to the node 261. When an ESD event occurs in the power line 113, the P type transistor 422 is turned on because the node 262 is at a high level. Thus, the node 261 is at the high level.

Figure 4B:
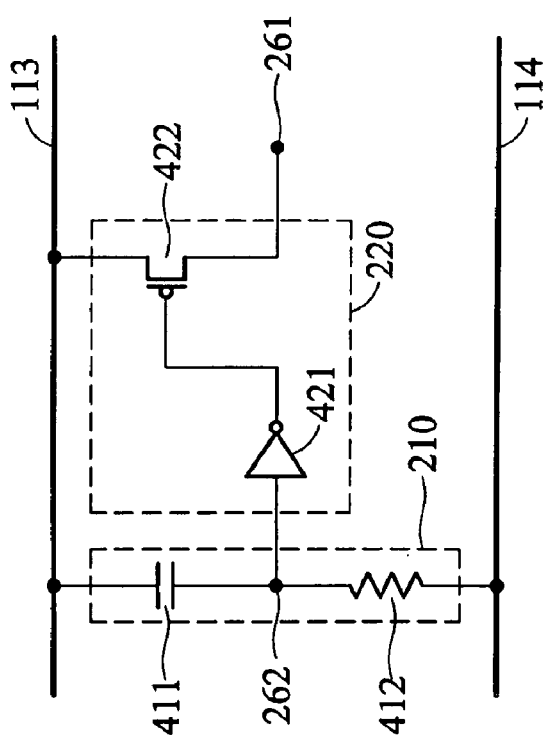
FIG. 4B is a schematic diagram of another exemplary embodiment of a detecting unit and a setting unit.

FIG. 4B is a schematic diagram of another exemplary embodiment of a detecting unit and a setting unit. FIG. 4B is similar to FIG. 4A with the exception that the setting unit 220 is an N type transistor 423. The N type transistor 423 comprises a gate coupled to the node 262, a source coupled to the power line 114, and a drain coupled to the node 261. When an ESD event occurs in the power line 113, the N type transistor 423 is turned on because the node 262 is at a high level. Thus, the node 261 is at a low level.

Figure 5A:
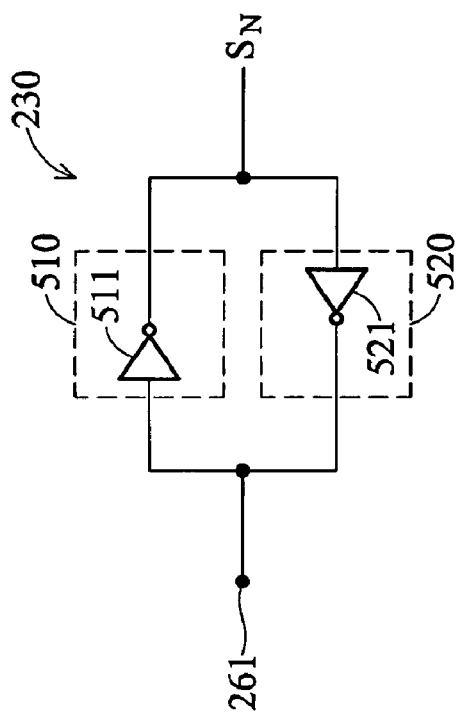
FIGS. 5A~5C are schematic diagrams of exemplary embodiments of the memory unit.
Figure 5C:
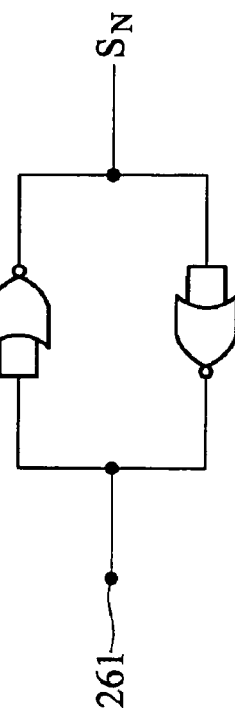
Figure 5B:
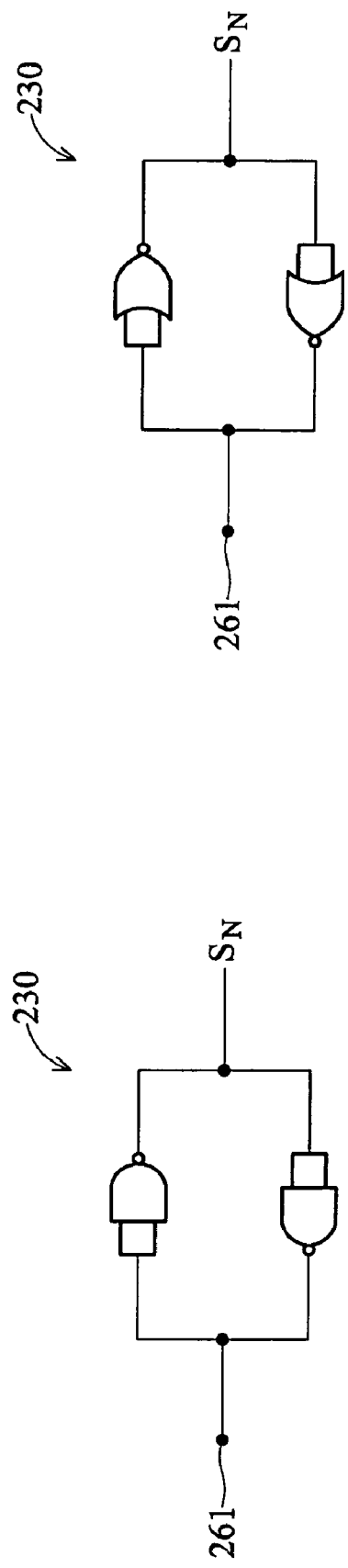

FIGS. 5A~5C are schematic diagrams of exemplary embodiments of the memory unit. Referring to FIG. 5A, the memory unit 230 comprises logic modules 510 and 520. The logic module 510 comprises an input terminal coupled to the node 261 and an output terminal providing the information signal $S_N$ to the external instrument 120. The logic module 520 comprises an input terminal coupled to the output terminal of the logic module 510 and an output terminal coupled to the node 261. The external instrument 120 determines whether an ESD event occurs in the power line 113 according to the information signal $S_N$. In this embodiment, logic module 510 is an inverter 511 and logic module 520 is an inverter 521. In some embodiments, each of logic modules 510 and 520 is an NAND gate or an NOR gate. The schematic diagrams of the NAND gate and the NOR gate are shown in FIGS. 5B and 5C.

The operating principles of the detecting unit 210, the setting unit 220, and the memory unit 230 are described in the following. Taking the detecting unit 210 and the setting unit 220 shown in FIG. 3A and the memory unit 230 shown in FIG. 5A as an example, assuming the information signal $S_N$ is at a low level when the reset unit 250 receives the reset signal $S_R$. Since the information signal $S_N$ is at the low level, the node 261 is at a high level due to the inverter 521.

When an ESD event occurs in the power line 113 and the power line 114 is grounded, the N type transistor 322 is turned on because the node 262 is at a low level. Thus, the level of the node 261 is transformed from the high level to the low level. In this embodiment, when the information signal $S_N$ is at the high level, the external instrument 120 determines that the ESD event occurred in the power line 113.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transient detection circuit providing an information signal to an external instrument when an electrostatic discharge (ESD) event occurs, comprising:
    a detecting unit coupled between a first power line and a second power line for detecting the ESD event;
    a setting unit setting a level of a first node according to the detection result;
    a memory unit controlling the information signal according to the level of the first node, wherein the information signal is at a first level when the ESD event occurs in the first power line;
    a buffer unit coupled between the memory unit and the external instrument for increasing a driving capability of the information signal; and
    a reset unit coupled between the buffer unit and the second power line for controlling the information signal at a second level opposite to the first level.

2. The transient detection circuit as claimed in claim 1, wherein the detecting unit comprises:
    a resistor coupled between the first power line and a second node; and
    a capacitor coupled between the second node and the second power line.

3. The transient detection circuit as claimed in claim 2, wherein the setting unit comprises:
    an inverter comprising an input terminal coupled to the second node; and an N type transistor comprising a gate coupled to an output terminal of the inverter, a source coupled to the second power line, and a drain coupled to the first node.

4. The transient detection circuit as claimed in claim 2, wherein the setting unit is a P type transistor comprising a gate coupled to the second node, a source coupled to the first power line, and a drain coupled to the first node.

5. The transient detection circuit as claimed in claim 1, wherein the detecting unit comprises:
   a capacitor coupled between the first power line and a second node; and
   a resistor coupled between the second node and the second power line.

6. The transient detection circuit as claimed in claim 5, wherein the setting unit comprises:
   an inverter comprising an input terminal coupled to the second node; and
   a P type transistor comprising a gate coupled to an output terminal of the inverter, a source coupled to the first power line, and a drain coupled to the first node.

7. The transient detection circuit as claimed in claim 5, wherein the setting unit is an N type transistor comprising a gate coupled to the second node, a source coupled to the second power line, and a drain coupled to the first node.

8. The transient detection circuit as claimed in claim 1, wherein the memory unit comprises:
   a first logic module comprising an input terminal coupled to the first node and an output terminal providing the information signal to the external instrument; and
   a second logic module comprising an input terminal coupled to the output terminal of the first logic module and an output terminal coupled to the first node.

9. The transient detection circuit as claimed in claim 8, wherein the first logic module is an inverter, an NAND gate, or an OR gate.

10. An integrated circuit providing an information signal to an external instrument when an electrostatic discharge (ESD) event occurs, comprising:
    a core unit coupled between a first power line and a second power line for executing related functions; and
    a transient detection circuit comprising:
       a detecting unit coupled between the first and the second power lines for detecting the ESD event;
       a setting unit setting a level of a first node according to the detection result;
       a memory unit controlling the information signal according to the level of the first node, wherein the information signal is at a first level when the ESD event occurs in the first power line;
       a buffer unit coupled between the memory unit and the external instrument for increasing a driving capability of the information signal; and
       a reset unit coupled between the buffer unit and the second rower line for controlling the information signal at a second level opposite to the first level.

11. The integrated circuit as claimed in claim 10, wherein the detecting unit comprises:
    a resistor coupled between the first power line and a second node; and
    a capacitor coupled between the second node and the second power line.

12. The integrated circuit as claimed in claim 11, wherein the setting unit comprises:
    an inverter comprising an input terminal coupled to the second node; and
    an N type transistor comprising a gate coupled to an output terminal of the inverter, a source coupled to the second power line, and a drain coupled to the first node.

13. The integrated circuit as claimed in claim 11, wherein the setting unit is a P type transistor comprising a gate coupled to the second node, a source coupled to the first power line, and a drain coupled to the first node.

14. The integrated circuit as claimed in claim 10, wherein the detecting unit comprises:
    a capacitor coupled between the first power line and a second node; and
    a resistor coupled between the second node and the second power line.

15. The integrated circuit as claimed in claim 14, wherein the setting unit comprises:
    an inverter comprising an input terminal coupled to the second node; and
    a P type transistor comprising a gate coupled to an output terminal of the inverter, a source coupled to the first power line, and a drain coupled to the first node.

16. The integrated circuit as claimed in claim 14, wherein the setting unit is an N type transistor comprising a gate coupled to the second node, a source coupled to the second power line, and a drain coupled to the first node.

17. The integrated circuit as claimed in claim 10, wherein the memory unit comprises:
    a first logic module comprising an input terminal coupled to the first node and an output terminal providing the information signal to the external instrument; and
    a second logic module comprising an input terminal coupled to the output terminal of the first logic module and an output terminal coupled to the first node.

18. The integrated circuit as claimed in claim 17, wherein the first logic module is an inverter, an NAND gate, or an OR gate.

* * * * *